United States Patent [19]

Nguyen

[11] Patent Number: 5,583,893
[45] Date of Patent: Dec. 10, 1996

[54] METHOD AND APPARATUS FOR SAFELY SUSPENDING AND RESUMING OPERATION OF AN ELECTRONIC DEVICE

[75] Inventor: Van M. Nguyen, Plano, Tex.

[73] Assignee: Texas Instruments Incorporated, Dallas, Tex.

[21] Appl. No.: 293,762

[22] Filed: Aug. 19, 1994

[51] Int. Cl.$^6$ .................................................. H04L 7/00
[52] U.S. Cl. ............... 375/357; 364/232.3; 364/927.81; 375/354
[58] Field of Search ......................... 375/357, 354; 341/52; 364/232.3, 927.81, 801, 221.2, 916.3, 933.8; 371/16.2

[56] References Cited

U.S. PATENT DOCUMENTS

| | | | |
|---|---|---|---|
| 5,175,544 | 4/1990 | McKeen | 341/52 |
| 5,329,471 | 6/1993 | Swoboda et al. | 364/578 |

Primary Examiner—Wellington Chin
Assistant Examiner—William Luther
Attorney, Agent, or Firm—Mark A. Valetti; W. James Brady, III; Richard L. Donaldson

[57] ABSTRACT

A method and apparatus are disclosed for safely suspending and resuming operation of an electronic device. The method comprises the step of generating a DUT-NXCLK-IN in response to a first NXCLK-IN to drive an electronic device 12 DUT-CLK-OUT is received from the device 12 wherein DUT-CLK-OUT comprises DUT-NXCLK-IN divided by a first value. ESYNER-CLK-OUT is generated by dividing NXCLK-IN by the first value. ESYNER-CLK-OUT is synchronized to signal-DUT-CLK-OUT. DUT-NXCLK-IN is disabled in response to a test grant signal TEST-GRANT when the ESYNER-CLK-OUT is in a predetermined one of a plurality of states. The disabled DUT-NXCLK-IN is re-enabled in response to the test grant signal TEST-GRANT when ESYNER-CLK-OUT is in the state immediately following the predetermined one of a plurality of states.

20 Claims, 2 Drawing Sheets

METHOD AND APPARATUS FOR SAFELY SUSPENDING AND RESUMING OPERATION OF AN ELECTRONIC DEVICE

CROSS-REFERENCE TO RELATED APPLICATION

This application is related to U.S. application Ser. No. 08/293,535, Attorney's Docket No. TI-18204, filed on Aug. 19, 1994 pending application filed on by Van Minh Nguyen and entitled "A Method For Generating Test Pattern Sets During A Functional Simulation and Apparatus", pending.

TECHNICAL FIELD OF THE INVENTION

This invention relates generally to controlling a clock for an electronic circuit, and more particularly, to a method and apparatus for safely suspending and resuming operation of a clock for an electronic device.

BACKGROUND OF THE INVENTION

Some modern electronic devices, such as, for example, microprocessors, microcontrollers, video processors, ASICS, etc., are equipped with scanning circuits to allow other circuits that interface with these devices either to scan out the internal state of the device, or to scan in an initial internal state. Such scanning circuits are particularly useful during the development of the device itself to provide information for de-bugging purposes. After the device has been developed, scanning circuits are useful for loading an initial state into the device during production testing. Such circuits are also useful for de-bugging and testing a larger system that uses the device as one component of the system.

Many devices have an internal clock divider that divides an input clock signal by a predetermined number and produces an output clock that comprises the divided down input clock. A common technique for implementing a scan feature for a device is to suspend the operation of the device's clock in response to a scan request. The scan request may be implemented using one or more control signals applied as inputs to the device. Then, after the clock has been safely stopped, it may be restarted for use in the scanning operation. At the conclusion of the scanning operation, the clock is again stopped, the control signals are removed, and the clock is then restarted.

This technique suffers from a major problem. When the clock is restarted after the scan operation, the state of the device's internal clock divider may be different from the state following the state it was in when the clock was stopped to initiate the scan operation. In other words, if the clock stopped in state X, it might restart in a state other than X+1. If the clock is restarted with the divider in an improper state, then the device may malfunction because these devices often carry out internal operations during each state of the clock divider. Restarting the clock in an improper state after a scan operation may cause various internal operations either to be skipped or erroneously performed twice. Either event can cause a device malfunction.

SUMMARY OF THE INVENTION

In accordance with the present invention, a method and apparatus are provided for safely suspending and resuming operation of an electronic device such as, for example, a microprocessor, a microcontroller, a video processor, an ASIC, etc. The method comprises generating a DUT-NX-CLK-IN signal in response to a NXCLK-IN signal to drive the electronic device. The electronic device divides the DUT-NXCLK-IN signal by a first predetermined value to produce a DUT-CLK-OUT signal which is, in turn, used in the operation of the electronic device. A ES4NER-CLK-OUT signal is generated which comprises the NXCLK-IN signal divided by the first predetermined value. The ES4NER-CLK-OUT signal is synchronized to the DUT-CLK-OUT signal. In response to a test grant signal, the DUT-NXCLK-IN signal is disabled when the ES4NER-CLK-OUT signal is in a predetermined one of a plurality of states. The disabled DUT-NXCLK-IN signal is re-enabled in response to the test grant signal when the ES4NER-CLK-OUT signal is in the state immediately following the predetermined one of a plurality of states.

One important technical advantage of the present invention is that the disclosed method and apparatus is independent of the modulo and implementation of the device's clock divider. The term, modulo, refers to the value of the divisor of the clock divider. For example, a divide by 3 counter has a modulo of 3. The method and apparatus works with existing devices that supply their divided down clocks as outputs. The hardware is external to the device and its cost is relatively low.

The present method and apparatus allow safe suspension of normal operations for interrogation of internal registers at a break point. Such interrogation can be extremely valuable during development of an electronic device and/or a system incorporating an electronic device. The invention is also useful during simulation of the electronic device for use in generating production test pattern sets. Similarly, the ability to suspend and resume normal operations may allow interrogation of internal memory of the device during development of the device and/or a system incorporating the device. While a device is undergoing testing, the disclosed invention may allow forced initialization of the device's internal state to allow additional tests to be conducted where the device would otherwise fail in such a way that it could not complete a given test. Even if one section of a complex device fails, other functioning sections of that device can still be tested. Other technical advantages of the disclosed invention will be apparent to those skilled in the art.

BRIEF DESCRIPTION OF THE DRAWINGS

For more complete understanding of the present invention and the advantages thereof, reference is now made to the following descriptions taken in conjunction with the accompanying drawings in which.

DETAILED DESCRIPTION OF THE INVENTION

The present invention and its advantages are best understood by referring to FIGS. 1 through 6 of the drawings, like numerals being used for like and corresponding parts of the various drawings.

Figure 1:
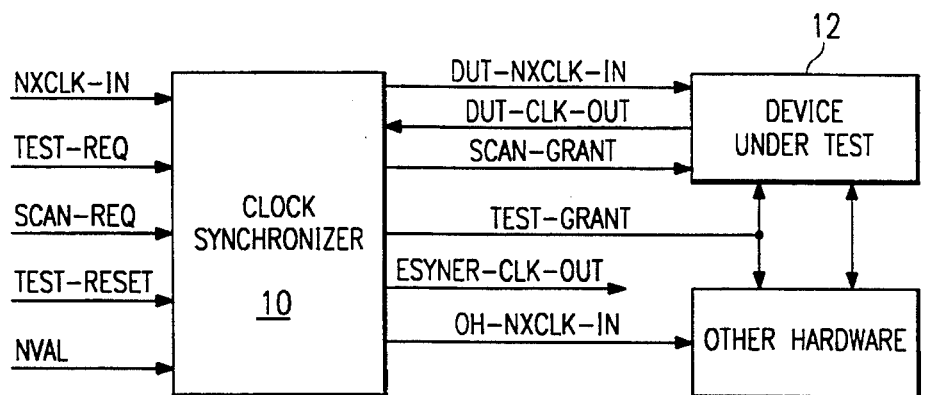
FIG. 1 illustrates a block diagram of a preferred embodiment of a clock synchronizer constructed in accordance with the teachings of the present invention and interfaced with a device under test and other hardware.

FIG. 1 illustrates a clock synchronizer 10 constructed in accordance with the teachings of the present invention. Clock synchronizer 10 interfaces with a device under test 12 and other hardware 14. Device under test 12, for example, can be a microprocessor, microcontroller, video processor, ASIC, etc. The operation of clock synchronizer 10 will be more fully described below but the following discussion gives a brief overview of the theory of its operation.

NXCLK-IN is a clock signal received as an input to clock synchronizer 10. Clock synchronizer 10 divides this signal down by modulo N to generate other clocks. NVAL is an input signal representing the value N, by which the device under test 12 divides its input clock signal. DUT-NXCLK-IN is a clock input signal to device under test 12 which is further divided modulo N to generate other clocks. DUT-CLK-OUT is a clock signal output by device under test 12 that comprises the signal DUT-NXCLK-IN divided modulo N. OH-NXCLK-IN is a clock signal generated by clock synchronizer 10 and used as a clock for other hardware 14. ESYNER-CLK-OUT is a clock signal generated by clock synchronizer 10 that is synchronized to DUT-CLK-OUT while DUT-NXCLK-IN is enabled. When signal DUT-NXCLK-IN is disabled, signal ESYNER-CLK-OUT keeps track of the proper state of the internal clock divider of device under test 12.

TEST-REQ is an asynchronous input signal to clock synchronizer 10 that indicates a request to suspend normal operation of DUT-NXCLK-IN. TEST-GRANT is a synchronous output indicating that DUT-NXCLK-IN has been safely stopped. TEST-GRANT may be synchronized to ESYNER-CLK-OUT and NXCLK-IN. TEST-RESET is an input signal that resets clock synchronizer 10 upon power up.

SCAN-REQ is an asynchronous input to clock synchronizer 10 requesting resumption of DUT-NXCLK-IN so that a scan operation may be performed on device under test 12. SCAN-GRANT is an output produced by clock synchronizer 12 indicating that a scan operation may proceed. SCAN-GRANT may be synchronized to ESYNER-CLK-OUT and NXCLK-IN.

Clock synchronizer 10 generates signal DUT-NXCLK-IN from signal NXCLK-IN. The state of the clock divider in device under test 12 will be random at power up. Clock synchronizer 10 synchronizes to the state of the internal clock divider of device under test 12 using DUT-CLK-OUT. Once synchronization is established, the state of the internal clock divider of device under test 12 is deterministic and predictable. Clock synchronizer 10 can thus determine what state the internal clock divider of device under test 12 was in when DUT-NXCLK-IN is disabled. Clock synchronizer 10 may then re-enable DUT-NXCLK-IN at the proper time. Because clock synchronizer 10 keeps ESYNER-CLK-OUT running continuously even when DUT-NXCLK-IN is disabled, signals needed to control device under test 12 can be properly synchronized even when its input clock is disabled. Clock synchronizer 10 can disable DUT-NXCLK-IN when the internal clock divider of device under test 12 is in a predetermined state, and re-enable DUT-NXCLK-IN so that the divider proceeds to the next state following the predetermined state when DUT-NXCLK-IN is re-enabled.

In summary, clock synchronizer 10 mirrors the operation of the internal clock divider of device under test 12 by synchronizing with DUT-CLK-OUT. Because clock synchronizer 10 can mirror the internal clock divider of device under test 12, the input clock to device under test 12 can be disabled and re-enabled in a manner that avoids device malfunctions.

Figure 2:
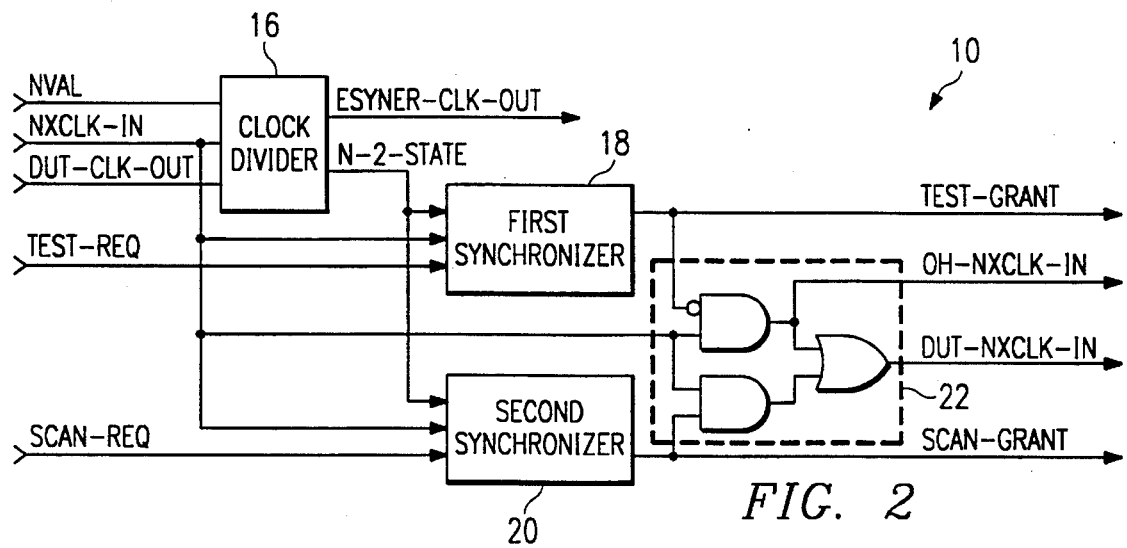
FIG. 2 illustrates a block diagram of one embodiment of a clock synchronizer constructed in accordance with the teachings of the present invention.

FIG. 2 illustrates an embodiment of clock synchronizer 10 constructed in accordance with the teachings of the present invention. Clock synchronizer 10 comprises clock divider 16, first synchronizer 18, second synchronizer 20 and clock logic circuit 22. Clock divider 16 couples to first synchronizer 18, second synchronizer 20 and clock logic circuit 22. First synchronizer 18 and second synchronizer 20 also couple to clock logic circuit 22.

Clock divider 16 is operable to receive NXCLK-IN and DUT-CLK-OUT and generate ESYNER-CLK-OUT. ESYNER-CLK-OUT comprises NXCLK-IN divided by a divide factor. When DUT-CLK-OUT is disabled, ESYNER-CLK-OUT continues to operate as DUT-CLK-OUT would have operated had it not been disabled. Clock divider 16 is further operable to generate a state signal indicating that ESYNER-CLK-OUT is currently in a predetermined one of a plurality of states. In the embodiment illustrated in FIG. 2, N–2-STATE indicates when ESYNER-CLK-OUT is in state N–2 where N refers to the modulo of the internal clock divider of device under test 12. Because clock synchronizer 10 can be used with electronic devices having varying size clock dividers, the modulo is an input to clock divider 16 and is represented by N. The operation of clock divider 16 will be more fully described in connection with FIG. 3 below.

First synchronizer 18 is operable to generate a test grant signal, TEST-GRANT, in response to an externally generated test request signal—TEST-REQ, the first state signal—N–2-STATE, generated by clock divider 16 and clock signal—NXCLK-IN. TEST-GRANT has an on-state and an off-state, and first synchronizer 18 causes TEST-GRANT to make a transition between the off-state and the on-state during a predetermined state of ESYNER-CLK-OUT. In the embodiment illustrated in FIG. 2, first synchronizer 18 causes a transition to occur when ESYNER-CLK-OUT is in state N–2. The operation of first synchronizer 18 will be more fully described in connection with FIG. 3 below.

Similarly, second synchronizer 18 is operable to generate a scan grant signal—SCAN-GRANT, in response to a scan request signal—SCAN-REQ, the first state signal—N–2-STATE, and clock signal—NXCLK-IN. SCAN-GRANT also has an on-state and an off-state. Second synchronizer 20 is further operable to cause SCAN-GRANT to make a transition between its on-state and off-state only during a predetermined state of ESYNER-CLK-OUT. In the embodiment illustrated in FIG. 2, second synchronizer 20 causes a transition during state N–2 in response to signal N–2-STATE from clock divider 16.

Clock logic circuit 22 controls the generation of OH-NXCLK-IN and DUT-NXCLK-IN, enabling and disabling these signals at the proper time. DUT-NXCLK-IN is equivalent to NXCLK-IN when DUT-NXCLK-IN is enabled. Clock logic circuit 22 is operable to enable and disable DUT-NXCLK-IN in response to TEST-GRANT and SCAN-GRANT. TEST-GRANT indicates DUT-NXCLK-IN should be disabled to enter test mode. Accordingly, once a test request is received, DUT-NXCLK-IN is disabled in response to the synchronously generated TEST-GRANT signal. Once TEST-GRANT is asserted (in its on-state), indicating that DUT-NXCLK-IN has been stopped, a scan may safely be initiated. Once TEST-GRANT is asserted (in its on-state), a scan request may be generated. In response to the scan request, clock logic circuit 22 re-enables DUT-NXCLK-IN in response to the SCAN-GRANT signal. Once SCAN-GRANT is asserted (in an on-state), DUT-NXCLK-IN may be safely restarted. Because SCAN-GRANT is synchronized to occur when ESYNER-CLK-OUT is in the predetermined state, DUT-NXCLK-IN is re-enabled in the proper state.

Similarly, when the scanning operation is finished, SCAN-GRANT may make the transition from its on-state to its off-state during the predetermined state of ESYNER-CLK-OUT, allowing DUT-NXCLK-IN to be disabled in the predetermined state. In the embodiment illustrated in FIG. 2, DUT-NXCLK-IN is disabled when its clock divider is in state N–2. Once SCAN-GRANT has made a transition from its on-state to its off-state, the test request signal may be removed, indicating that clock synchronizer 10 should re-enable DUT-NXCLK-IN. Clock logic circuit 22 re-enables DUT-NXCLK-IN in the state following the predetermined state after TEST-GRANT makes a transition from its on-state to its off-state during the predetermined state. In the embodiment illustrated in FIG. 2, DUT-NXCLK-IN is re-enabled in state N–1.

Because other hardware interacting with the device under test is normally not re-enabled during a scan operation, OH-NXCLK-IN is disabled during the entire sequence above. OH-NXCLK-IN is disabled after TEST-GRANT is asserted (makes a transition from its off-state to its on-state). Because TEST-GRANT is synchronized, OH-NXCLK-IN also is disabled during a predetermined state and re-enabled in the state following the predetermined state. In the embodiment illustrated in FIG. 2, OH-NXCLK-IN is disabled during state N–2 and re-enabled in state N–1.

Figure 3:
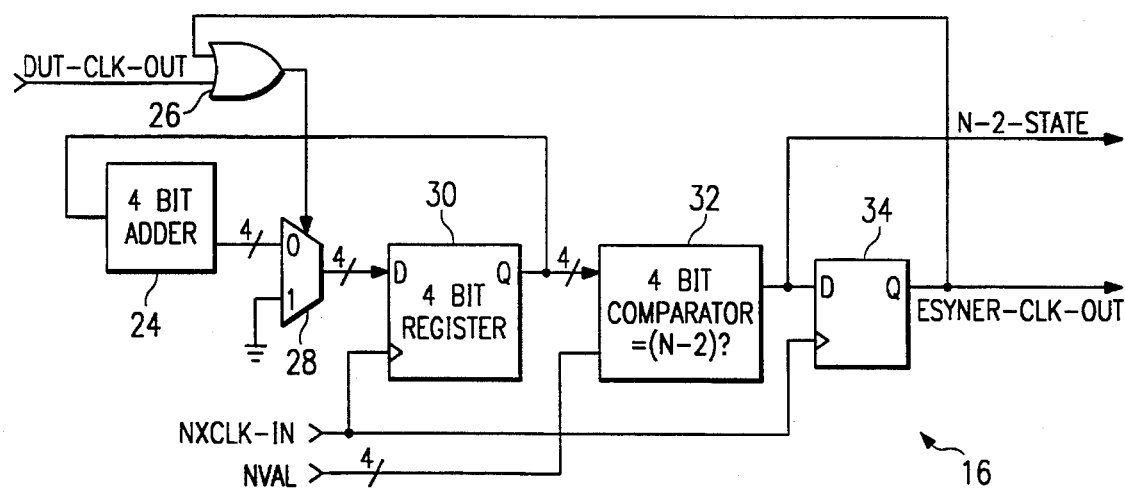
FIG. 3 illustrates a block diagram of a clock divider that can be used in the clock synchronizer circuit of FIG. 2.

FIG. 3 illustrates an embodiment of clock divider 16 of FIG. 2 constructed in accordance with the teachings of the present invention. Clock divider 16 comprises adder 24, OR-gate 26, multiplexer 28, register 30, comparator 32, and flip-flop 34. Adder 24 couples to multiplexer 28 and register 30. In this embodiment, adder 24 is an incrementer. Because adder 24 is an incrementer, it has only one input shown. The other input (not explicitly shown) may be hard wired to add one to the illustrated input. Multiplexer 28 also couples to register 30 and OR-gate 26. OR-gate 26 also couples to flip-flop 34. Register 30 couples to comparator 32 while comparator 32 couples to flip-flop 34.

Clock divider 16 is programmable in that the modulo of the internal clock divider of the device under test, N, can be input to comparator 32 using the inputs, NVAL. Comparator 32 controls the modulo of clock divider 16. In the embodiment illustrated in FIG. 3, adder 24, multiplexer 28, register 30, and comparator 32 are all four bit components. However, components having a different number of bits could be used without departing from the scope and teachings of the present invention.

In the embodiment illustrated in FIG. 3, DUT-CLK-OUT passes through N states, 0 through N–1. DUT-CLK-OUT has a high value during state N–1 and a low value during all other states. After power up, clock divider 16 synchronizes ESYNER-CLK-OUT to DUT-CLK-OUT. As soon as DUT-CLK-OUT enters state N–1, it causes multiplexer 28 to present inputs equivalent to state 0 to appear at register 30. Upon the next transition of NXCLK-IN, state 0 is loaded into register 30. For N≠2, comparator 32 will produce a low output as will ESYNER-CLK-OUT upon the next positive transition of NXCLK-IN. Register 30 continues to increase by one each clock cycle as adder 24 increments the output of register 30 by one. Multiplexer 28 passes the output of adder 24 to register 30 because DUT-CLK-OUT remains low until state N–1. Once register 30 has reached state N–2, comparator 32 produces a high output. Upon the next positive transition of NXCLK-IN, ESYNER-CLK-OUT will be high. ESYNER-CLK-OUT is now synchronized to DUT-CLK-OUT. Clock divider 16 of FIG. 3 may properly synchronize ESYNER-CLK-OUT to DUT-CLK-OUT after a few transitions of NXCLK-IN upon power up.

Once ESYNER-CLK-OUT is properly synchronized to DUT-CLK-OUT, clock divider 16 will continue to produce ESYNER-CLK-OUT even when DUT-CLK-OUT is disabled. Because ESYNER-CLK-OUT is fed back through OR-gate 26 to control multiplexer 28, ESYNER-CLK-OUT will itself cause a transition to state 0 from state N–1 when ESYNER-CLK-OUT is in state N–1. DUT-CLK-OUT is only received to initially synchronize ESYNER-CLK-OUT to the internal clock divider of the device under test.

Figure 4:
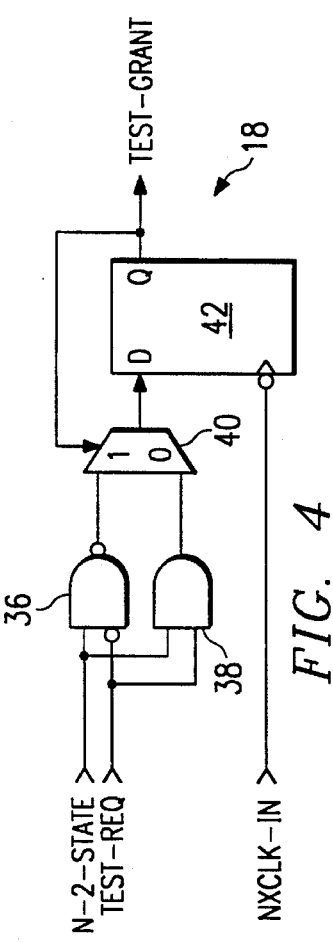
FIG. 4 illustrates a block diagram of a synchronizer that can be used in the clock synchronizer circuit of FIG. 2.

FIG. 4 illustrates an embodiment of first synchronizer 18 of FIG. 2 constructed in accordance with the teachings of the present invention. The embodiment illustrated in FIG. 4 may also be used for second synchronizer 20. First synchronizer 18 comprises AND-gate 36, AND-gate 38, multiplexer 40, and flip-flop 42. AND-gate 36 couples to multiplexer 40. AND-gate 38 couples to multiplexer 40. Multiplexer 40 couples to flip-flop 42 and is controlled by the output of flip-flop 42.

The operation of first synchronizer 18 is as follows. Initially, TEST-GRANT is in an off-state (low). When an asynchronously generated test request, TEST-REQ, is received, first synchronizer 18 waits until clock signal ESYNER-CLK-OUT is in state N–2 by receiving signal N–2-STATE from clock divider 16 (not explicitly shown). Once ESYNER-CLK-OUT is in state N–2, the output of AND-gate 38 goes high, causing the input to flip-flop 42 to be high. Upon the next transition from high to low of NXCLK-IN, TEST-GRANT goes high. Because TEST-GRANT is now high, input 1 of multiplexer 40 appears on the output of multiplexer 40. Accordingly, the output of AND-gate 36 now controls the input to flip-flop 42. AND-gate 36 will continue to produce a high value at the input of flip-flop 42 until TEST-REQ goes low.

When TEST-REQ goes low, first synchronizer 18 synchronously causes TEST-GRANT to make a transition from high to low. Once TEST-REQ goes low, AND-gate 36 will cause the input to flip-flop 42 to go low the next time ESYNER-CLK-OUT is in state N–2. Again, first synchronizer 18 makes this transition in response to the signal N–2-STATE. Once ESYNER-CLK-OUT has again reached state N–2, TEST-GRANT makes a transition from high to low upon the next transition from high to low of NXCLK-IN.

Although the illustrated embodiment synchronizes TEST-GRANT and SCAN-GRANT to ESYNER-CLK-OUT when that signal is state N–2, any state of ESYNER-CLK-OUT could be chosen without departing from the scope of the teachings of the present invention. In general, the clock signal for the device under test may be controlled so that it is re-enabled in the state following the state in which it was disabled prior to a scan operation. In other words, if normal operations were suspended when the clock divider was in state X prior to the scan operation, operations should resume with the clock divider in state X+1.

Figure 5:
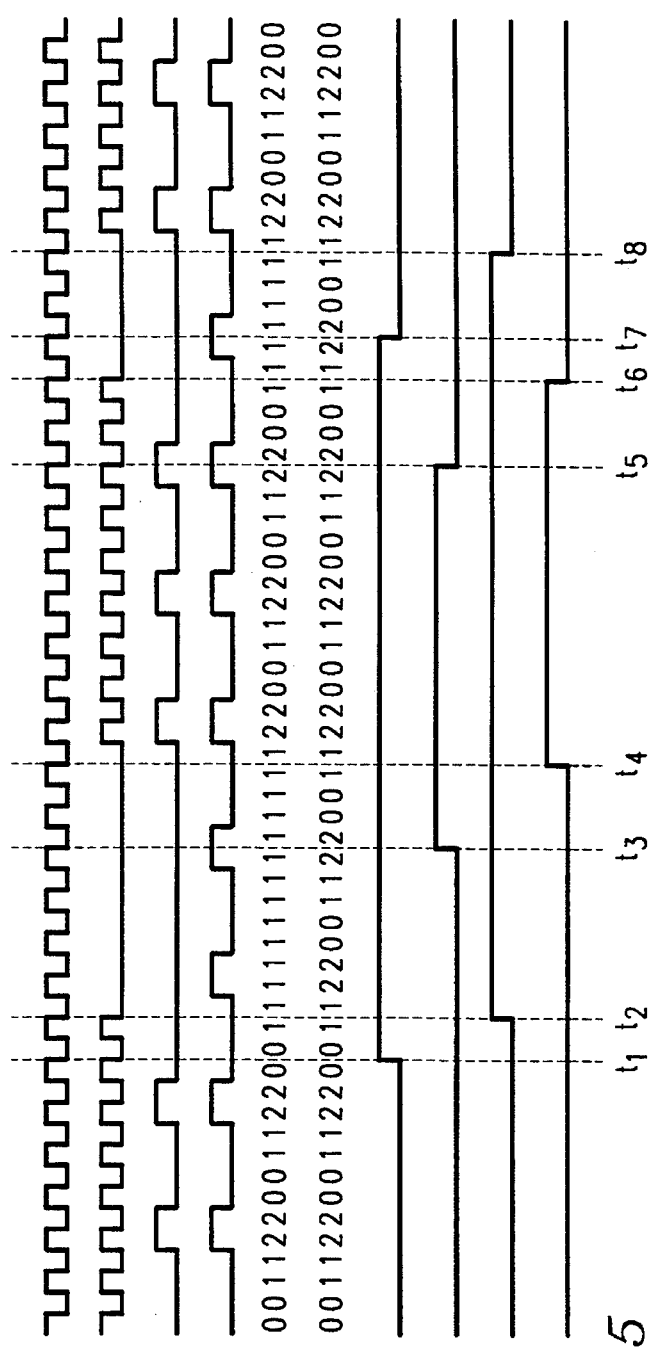
FIG. 5 illustrates waveform and state information demonstrating the operation of a clock synchronizer circuit constructed in accordance with the teachings of the present invention.

FIG. 5 illustrates the operation of clock synchronizer 10 of FIGS. 1 and 2 for a device under test 12 having a modulo 3 internal clock divider. FIGURE 5 illustrates waveforms for the signals NXCLK-IN, DUT-NXCLK-IN, DUT-CLK-OUT, ESYNER-CLK-OUT, TEST-REQ, SCAN-REG, TEST-GRANT, and SCAN-GRANT. FIG. 5 also illustrates state information for DUT-CLK-OUT and ESYNER-CLK-OUT. The waveforms and state information of FIG. 5 result from the operation of the embodiment of clock synchronizer 10 illustrated in FIG. 2. Accordingly, TEST-GRANT and SCAN-GRANT are synchronized to ESYNER-CLK-OUT and make transitions during state N−1. In the present case, because N is 3, TEST-GRANT and SCAN-GRANT make transitions while ESYNER-CLK-OUT is in state 1.

At time $t_1$, clock synchronizer 10 receives a test request signal. Although TEST-REQ and SCAN-REQ signals are coincidentally illustrated as making transitions synchronously with the NXCLK-IN signal, the TEST-REQ and SCAN-REQ signals may occur at any time. At time $t_2$, TEST-GRANT makes a transition from low to high. In accordance with the discussion above, TEST-GRANT makes its transition while ESYNER-CLK-OUT is in state 1 and makes the transition at the falling edge of NXCLK-IN. DUT-NXCLK-IN is disabled in response to TEST-GRANT. At time $t_3$, a scan request is received by clock synchronizer 10. SCAN-GRANT, however, does not make a transition from low to high until time $t_4$ because SCAN-GRANT is synchronized to make transitions at a falling edge of NXCLK-IN and while ESYNER-CLK-OUT is in state 1.

Upon assertion of SCAN-GRANT (transition from low to high in this embodiment), DUT-NXCLK-IN is re-enabled for a scan operation. Consistent with the above discussion DUT-NXCLK-IN is re-enabled in state 2, the state immediately following the state in which it was disabled. After the scanning operation is complete, SCAN-REQ goes low at time $t_5$. SCAN-GRANT, however, does not go low until ESYNER-CLK-OUT is in state 1. Again, the transition of SCAN-GRANT occurs at the falling edge of DUT-NXCLK-IN. DUT-NXCLK-IN is disabled once again upon completion of the scanning operation at time $t_6$. At time $t_7$, TEST-REQ transitions from high to low, indicating the conclusion of a test sequence. TEST-GRANT, however, is not deasserted (does not make a transition from high to low) until time $t_8$. At time $t_8$, ESYNER-CLK-OUT is in state 1 and TEST-GRANT makes its transition upon the falling edge of NXCLK-IN. Following the deassertion of TEST-GRANT (transition from high to low), DUT-NXCLK-IN is re-enabled in state 2, the state following the state in which it was disabled when TEST-GRANT was asserted.

Because a device under test may be disabled for scanning purposes frequently during development of the device, clock synchronizer 10 can be useful during de-bugging and testing of the design of device under test 12. Many devices are currently designed using functional simulators running on digital computers. Because clock synchronizer 10 may be useful during this design process, clock synchronizer 10 may be simulated on a simulator to aid in developing electronic devices.

Figure 6:
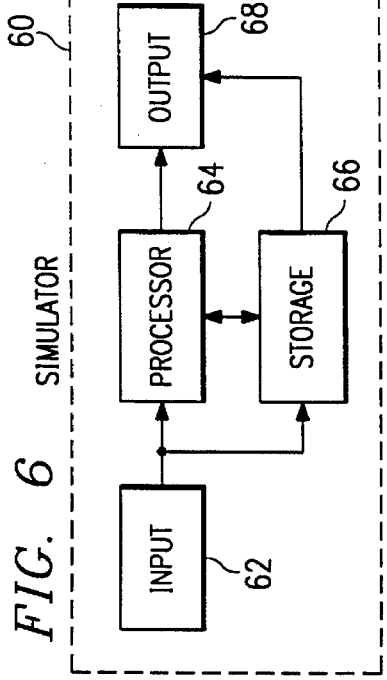
FIG. 6 illustrates a block diagram of a simulator for simulating a clock synchronizer circuit constructed in accordance with the teachings of the present invention.

FIG. 6 illustrates a block diagram of a simulator 60 which can be used to simulate clock synchronizer 10. Simulator 60 comprises input circuitry 62 coupled to processor 64 and storage 66. Output circuitry 68 couples to processor 64 and storage 66. Processor 64, for example, may be part of a computer workstation. A functional simulator (not explicitly shown) can be a software program stored in storage 66 and capable of receiving input from input circuitry 62 producing output through output circuitry 68 and running on processor 64. Input circuitry 62 may be operable to receive data describing the structure of clock synchronizer 10. This data may be stored in storage 66. Processor 64 may simulate clock synchronizer 10 using data input by using input circuitry 62. The results of the simulation may be stored in storage 66 and output on output storage 68. Processor 64 in running the functional simulator may simulate the application of electrical signals to clock synchronizer 10 and/or an electronic device under development. The output data produced as a result of the simulation can be captured and stored in storage 66 or output through output circuitry 68 and may represent the state of electrical signals applied to electronic device being developed and/or clock synchronizer 10.

Although the present invention and its advantages have been described in detail, it should be understood that various changes, substitutions, and alternations can be made therein without departing from the spirit and scope of the invention as defined by the appending claims.

What is claimed is:

1. A method for safely suspending and resuming operation of an electronic device, comprising the steps of:

generating a first clock signal; generating a second clock signal in response to said first clock signal, said second clock signal serving as a clock for said electronic device;

receiving a third clock signal from said electronic device, said third clock signal being said second clock signal divided by a first predetermined value; generating a fourth clock signal comprising said first clock signal divided by said first predetermined value; synchronizing said fourth clock signal to said third clock signal;

disabling said second clock signal in response to a test grant signal when said fourth clock signal is in a predetermined one of a plurality of states; and re-enabling said disabled second clock signal in response to removal of said test grant signal when said fourth clock signal is in a state immediately following said predetermined one of a plurality of states.

2. The method of claim 1, wherein the step of disabling said second clock signal occurs in response to a transition of said first clock signal.

3. The method of claim 1, wherein the step of re-enabling said disabled second clock signal occurs in response to a transition of said first clock signal.

4. The method of claim 1, further comprising the step of:

generating a scan grant signal having a first on state and a first off state in response to a scan request signal and said first clock signal, said test grant signal making a transition from said first off state to said first on state during said predetermined one of a plurality of states.

5. The method of claim 1, further comprising the step of:

generating a test grant signal having a second on state and a second off state in response to a test request signal and said second clock signal, said test grant signal making a transition from said second off state to said second on state during said predetermined one of a plurality of states.

6. The method of claim 5, further comprising the step of:

generating an external hardware clock signal capable of being enabled and disabled, wherein said external hardware clock signal which is enabled comprises said first clock signal, and wherein said external hardware clock signal is enabled when said test grant signal is in said second off state and disabled when said test grant signal is in said second on state.

7. The method of claim 5, further comprising the step of:

generating a scan grant signal having a first on state and a first off state in response to a scan request signal and said second clock signal, said test grant signal making a transition from said first off state to said first on state during said predetermined one of a plurality of states.

8. The method of claim 5, further comprising the step of:

generating a scan grant signal having a first on state and a first off state in response to a scan request signal and said second clock signal, said test grant signal making a transition from said first off state to said first on state during said predetermined one of a plurality of states; and wherein said disabling step further comprises the step of disabling said second clock signal when said test grant signal is in said second on state and said scan grant signal is in said first off state and when said fourth clock signal is in said predetermined one of a plurality of states.

9. A clock synchronizer for use with a clock source and an electronic circuit, said electric circuit operable to receive a first clock signal and generate a second clock signal, said second clock signal comprising said first clock signal divided by a first predetermined value, said clock source operable to generate a third clock signal, said clock synchronizer comprising:

a clock divider, said clock divider operable to receive said second clock signal and said third clock signal and generate a fourth clock signal comprising said third clock signal divided by a predetermined divide factor, said fourth clock signal synchronized to said second clock signal, said clock divider further operable to generate a first state signal indicating that said fourth clock signal is in a predetermined one of a plurality of states;

a first synchronizer operable to generate a test grant signal in response to an externally generated test request signal, said first state signal and said third clock signal; and a clock logic circuit, said clock logic circuit operable to generate said first clock signal, said first clock signal comprising said third clock signal, and said clock logic circuit further operable to enable and disable said first clock signal in response to said test grant signal.

10. The clock synchronizer of claim 9 wherein said clock divider includes a divide factor input and factor storage circuitry, said divide factor input operable to receive said divide factor, said factor storage circuitry operable to store said divide factor.

11. The clock synchronizer of claim 9 wherein said divide factor comprises said first predetermined value.

12. The clock synchronizer of claim 9 wherein said test grant signal has a first on state and a first off state, said first synchronizer further operable to cause said test grant signal to transition between said first off state and said first on state during said predetermined one of a plurality of states in response to said first state signal.

13. The clock synchronizer of claim 12 wherein said clock logic circuit is further operable to disable said first clock signal during said predetermined one of a plurality of states.

14. The clock synchronizer of claim 9, further comprising:

a second synchronizer operable to generate a scan grant signal in response to an externally generated scan request signal, said first state signal and said third clock signal; and wherein said clock logic circuit is further operable to disable said first clock signal in response to said scan grant signal.

15. The clock synchronizer of claim 14, wherein said scan grant signal has a second on state and a second off state, said second synchronizer further operable to cause said scan grant signal to transition between said second off state and said second on state during said predetermined one of a plurality of states in response to said first state signal; and wherein said clock logic circuit is further operable to disable said first clock signal during said predetermined one of a plurality of states.

16. The clock synchronizer of claim 15, wherein said clock divider includes a divide factor input and factor storage circuitry, said divide factor input operable to receive said divide factor, said factor storage circuitry operable to store said divide factor;

wherein said divide factor comprises said first value; and wherein said test grant signal includes a first on state and a first off state, said first synchronizer further operable to cause said test grant signal to transition between said first off state and said first on state during said predetermined one of a plurality of states in response to said first state signal.

17. A simulator for simulating a clock synchronizer for use with a clock source and an electronic circuit, said circuit operable to receive a first clock signal and generate a second clock signal, said second clock signal comprising said first clock signal divided by a first value, said clock source operable to generate a third clock signal, comprising:

input circuitry operable to receive data representing said clock synchronizer, said synchronizer including (1) a clock divider, said clock divider operable to receive said second clock signal and said third clock signal and generate a fourth clock signal comprising said third clock signal divided by a predetermined divide factor, said fourth clock signal synchronized to said second clock signal, said clock divider further operable to generate a first state signal indicating that said fourth clock signal is in a predetermined one of a plurality of states, and wherein said divide factor is said first value, (2) a first synchronizer operable to generate a test grant signal in response to an externally generated test request signal, said first state signal and said third clock signal, (3) a clock logic circuit, said clock logic circuit operable to generate said first clock signal, said first clock signal comprising said third clock signal, and said clock logic circuit further operable to enable and disable said first clock signal in response to said test grant signal, (4) wherein said test grant signal has a first on state and a first off state, said first synchronizer further operable to cause said test grant signal to transition between said first off state and said first on state during said predetermined one of a plurality of states in response to said first state signal, (5) wherein said clock logic circuit is further operable to disable said first clock signal during said predetermined one of a plurality of states;

a processor operable to simulate said circuit using said data wherein said processor simulates the application of electrical signals to said circuit;

output circuitry operable to output data representing the results of said simulation, said data representative of the state of electrical signals in a plurality of locations in said circuit.

18. The simulator of claim 17 wherein said test grant signal has a first on state and a first off state, said first synchronizer further operable to cause said test grant signal to make a transition between said first off state and said first on state during said predetermined one of a plurality of states in response to said first state signal.

19. The simulator of claim 17 wherein said clock synchronizer circuit further comprises:

a second synchronizer operable to generate a scan grant signal in response to an externally generated scan request signal, said first state signal and said third clock signal; and wherein said clock logic circuit is further operable to disable said first clock signal in response to said scan grant signal.

20. The simulator of claim 19 wherein said scan grant signal has a second on state and a second off state, said second synchronizer further operable to cause said test grant signal to make a transition between said first off state and said first on state during said predetermined one of a plurality of states in response to said first state signal.

* * * * *